United States Patent
Reddy et al.

(10) Patent No.: US 6,300,794 B1
(45) Date of Patent: *Oct. 9, 2001

(54) PROGRAMMABLE LOGIC DEVICE WITH HIERARCHICAL INTERCONNECTION RESOURCES

(75) Inventors: Srinivas T. Reddy, Fremont; Richard G. Cliff, Milpitas; Christopher F. Lane, Campbell; Ketan H. Zaveri, San Jose; Manuel M. Mejia, San Jose; David Jefferson, San Jose; Bruce B. Pedersen, San Jose; Andy L. Lee, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/488,025

(22) Filed: Jan. 20, 2000

Related U.S. Application Data

(63) Continuation of application No. 09/454,624, filed on Dec. 6, 1999, which is a continuation of application No. 08/920,298, filed on Aug. 28, 1997, now Pat. No. 5,999,016, application No. 09/488,025, which is a continuation of application No. 09/363,162, filed on Jul. 28, 1999, now Pat. No. 6,181,160, which is a division of application No. 08/855,192, filed on May 13, 1997, now Pat. No. 5,977,793

(60) Provisional application No. 60/028,206, filed on Oct. 10, 1996, provisional application No. 60/028,207, filed on Oct. 10, 1996, and provisional application No. 60/037,815, filed on Feb. 5, 1997.

(51) Int. Cl.[7] .......................... H01L 25/00; H03K 19/177
(52) U.S. Cl. .................................................. 326/41; 326/39
(58) Field of Search ................................. 326/38, 39, 40, 326/41, 47

(56) References Cited

U.S. PATENT DOCUMENTS

Re. 34,363   8/1993   Freeman ............................... 307/465

(List continued on next page.)

FOREIGN PATENT DOCUMENTS 0 192 875 A2   9/1986 (EP) ................................ H03K/5/02

(List continued on next page.)

OTHER PUBLICATIONS

"XC5000 Logic Cell Array Family, Technical Data, Advance Information," Xilinx, Inc., Feb. 1995.

(List continued on next page.)

*Primary Examiner*—Michael Tokar
*Assistant Examiner*—Steven S. Paik
(74) *Attorney, Agent, or Firm*—Fish & Neave; Robert R. Jackson; Manu J. Tejwani

(57) ABSTRACT

A programmable logic device has a plurality of super-regions of programmable logic disposed on the device in a two-dimensional array of intersecting rows and columns of super-regions. Horizontal and vertical inter-super-region interconnection conductors are associated with each row and column, respectively. Each super-region includes a plurality of regions of programmable logic, and each region includes a plurality of subregions of programmable logic. Inter-region interconnection conductors are associated with each super-region, principally for bringing signals into the super-region and interconnecting the regions in the super-region. Local conductors are associated with each region, principally for bringing signals into the region. At the super-region level the device may be horizontally and vertically isomorphic, which helps make it possible to produce devices with low aspect ratios of one or nearly one. Shared driver circuits may be provided (e.g., for (1) receiving signals from the subregions and the horizontal and/or vertical conductors, and (2) applying selected received signals to the inter-region conductors, the horizontal and vertical conductors, and possibly also the local conductors). The horizontal and/or vertical conductors may be axially segmented and buffering circuitry may be provided for programmably stitching together axial segments to make longer conductors.

20 Claims, 9 Drawing Sheets

U.S. PATENT DOCUMENTS

| | | | |
|---|---|---|---|
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,835,418 | 5/1989 | Hsieh | 307/473 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,023,606 | 6/1991 | Kaplinsky | 340/825.8 |
| 5,073,729 | 12/1991 | Greene et al. | 307/465.1 |
| 5,121,006 | 6/1992 | Pedersen | 307/465 |
| 5,122,685 | 6/1992 | Chan et al. | 307/465.1 |
| 5,132,571 | 7/1992 | McCollum et al. | 307/465.1 |
| 5,144,166 | 9/1992 | Camarota et al. | 307/465.1 |
| 5,208,491 | 5/1993 | Ebeling et al. | 307/465 |
| 5,218,240 | 6/1993 | Camarota et al. | 307/443 |
| 5,220,214 | 6/1993 | Pedersen | 307/465 |
| 5,225,719 | 7/1993 | Agrawal et al. | 307/465 |
| 5,255,203 | 10/1993 | Agrawal | 364/489 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |
| 5,274,581 | 12/1993 | Cliff et al. | 364/784 |
| 5,338,984 | 8/1994 | Sutherland | 307/465.1 |
| 5,350,954 | 9/1994 | Patel | 307/465 |
| 5,371,422 | 12/1994 | Patel et al. | 326/41 |
| 5,448,186 | 9/1995 | Kawata | 326/41 |
| 5,455,525 | 10/1995 | Ho et al. | 326/41 |
| 5,457,410 | 10/1995 | Ting | 326/41 |
| 5,467,029 | 11/1995 | Taffe et al. | 326/41 |
| 5,469,003 | 11/1995 | Kean | 326/39 |
| 5,483,178 | 1/1996 | Costello et al. | 326/41 |
| 5,509,128 | 4/1996 | Chan | 395/311 |
| 5,517,135 | 5/1996 | Young | 326/86 |
| 5,541,530 | 7/1996 | Cliff et al. | 326/41 |
| 5,583,452 | 12/1996 | Duong et al. | 326/49 |
| 5,627,480 | 5/1997 | Young et al. | 326/17 |
| 5,656,950 | 8/1997 | Duong et al. | 326/41 |
| 5,844,424 | 12/1998 | Krishnamurthy et al. | 326/49 |
| 5,977,793 * | 11/1999 | Reddy et al. | 326/41 |
| 5,999,016 * | 12/1999 | McClintock et al. | 326/41 |

FOREIGN PATENT DOCUMENTS

| | | | |
|---|---|---|---|
| 192875 | 9/1986 | (EP) | H03K/5/02 |
| 463746 A2 | 1/1992 | (EP) | G06F/15/60 |
| 2279168 A | 12/1994 | (GB) | H03K/19/177 |
| 630115 A2 | 12/1994 | (EP) | H03K/19/177 |
| 2295738 A | 6/1996 | (GB) | H03K/19/177 |
| 2300947 A | 11/1996 | (GB) | H03K/19/177 |
| 2300953 A | 11/1996 | (GB) | H03K/19/177 |
| WO 95/04404 | 2/1995 | (WO) | H03K/19/177 |
| WO 95/22205 | 8/1995 | (WO) | H03K/19/177 |
| WO 95/28769 | 10/1995 | (WO) | H03K/19/177 |

OTHER PUBLICATIONS

*ACT Family Field Programmable Gate Array Databook*, Apr. 1992, Actel Corporation, Sunnyvale, CA, pp. 1–35 through 1–44.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

R. C. Minnick, "A Survey of Microcellular Research," Journal of the Association for Computing Machinery, vol. 14, No. 2, pp. 203–241, Apr. 1967.

*Recent Developments in Switching Theory*, A. Mukhopadhyay, ed., Academic Press, New York, 1971, chapters VI and IX, p. 229–254 and 369–422.

S. E. Wahlstrom, "Programmable Logic Arrays—Cheaper by the Millions," Electronics, Dec. 11, 1967, pp. 90–95.

*The Programmable Logic Data Book*, 1988, Xilinx, Inc., San Jose, CA.

The Programmable Gate Array data Book, 1994, Xilinx, Inc., San Jose, CA, pp. 2–7, 2–12, and 2–13.

* cited by examiner

PROGRAMMABLE LOGIC DEVICE WITH HIERARCHICAL INTERCONNECTION RESOURCES

This application claims the benefit of provisional application No. 60/028,206, filed Oct. 10, 1996, provisional application No. 60/028,207, filed Oct. 10, 1996, and provisional application No. 60/037,815, filed Feb. 5, 1997. This is a continuation of application Ser. No. 09/363,162, filed Jul. 28, 1999 now U.S. Pat. No. 6,181,160, which is a division of application Ser. No. 08/855,192, filed May 13, 1997 (now U.S. Pat. No. 5,977,793). This is also a continuation of application Ser. No. 09/454,624, filed Dec. 6, 1999, which is a continuation of application Ser. No. 08/920,298, filed Aug. 28, 1997 now U.S. Pat. No. 5,999,016. All of applications Ser. Nos. 08/855,192, 08/920,298, 09/363,162, and 09/454,624 are hereby incorporated by reference herein in their entireties.

BACKGROUND OF THE INVENTION

This invention relates to programmable logic devices, and more particularly to programmable logic devices with increased logic and interconnection capability.

Programmable logic devices are well known as is shown, for example, by Pedersen et al. U.S. Pat. No. 5,260,610, Cliff et al. U.S. Pat. No. 5,260,611, Cliff et al. U.S. Pat. No. 5,689,195, and Cliff et al. U.S. Pat. No. 5,909,126. All of these references are hereby incorporated by reference herein in their entirety.

There is continued interest in programmable logic devices with greater logic capacity. This calls for devices with larger numbers of regions of programmable logic. It also calls for logic devices with more programmable interconnection resources for making needed connections between the increased numbers of logic regions. It is important, however, to add interconnection resources judiciously so that those resources do not begin to take up excessive amounts of space on the device, thereby unduly interfering with the amount of additional logic that can be included in the device. To accomplish this it would be desirable to find ways to organize programmable logic devices, and especially the interconnection resources in programmable logic devices, so that the efficiency of utilization of the interconnection resources can be greater. In this way more interconnectivity can be provided in the device to serve more logic in the device without simply directly scaling up the interconnection resources with the increased logic capability.

An example of a possible problem associated with merely scaling up known programmable logic device architectures is illustrated by the case of the architecture shown in above-mentioned Cliff et al. U.S. Pat. No. 5,689,195. In this type of device regions of programmable logic are disposed on the device in a plurality of rows of such regions. Each row has an associated plurality of horizontal interconnection conductors for selectively conveying signals to, from, and between the regions in that row. Region-feeding conductors are associated with each region for selectively bringing signals from the associated horizontal conductors into the region as input signals. Output signals produced by each region are selectively applied to the associated horizontal conductors. Vertical interconnection conductors are provided for selectively conveying signals between the rows of the device. Accordingly, a programmable logic device having this type of architecture basically comprises a row of logic regions and associated interconnection conductors that has been replicated a number of times and then provided with vertical interconnection conductors for interconnecting the rows. To meet the demand for larger and larger devices it may not be practical to indefinitely increase the number of regions in a row or the number of rows due to manufacturing constraints. For example, the aspect ratio of the device may tend to become too large.

In view of the foregoing, it is an object of this invention to provide improved organizations ("architectures") for programmable logic devices.

It is a more particular object of this invention to provide programmable logic device architectures that can efficiently accommodate larger numbers of programmable logic regions.

It is another more particular object of this invention to provide programmable logic device architectures which permit higher densities of logic regions and which have more uniform horizontal and vertical characteristics so that there is less preference for one direction over the other and therefore less tendency toward designs with high aspect ratios.

SUMMARY OF THE INVENTION

These and other objects of the invention are accomplished in accordance with the principles of the invention by providing programmable logic array integrated circuit devices having a plurality of super-regions of programmable logic disposed on the device in a two-dimensional array of intersecting rows and columns of super-regions. Each super-region includes a plurality of regions of programmable logic and a plurality of inter-region interconnection conductors for conveying signals to and between the regions in that super-region. In some embodiments each super-region may be somewhat like a short, folded row in the exemplary devices described in the background section of this specification. For example, in these embodiments the regions in each super-region may be disposed along both sides of that super-region's inter-region interconnection conductors. Thus in these embodiments a super-region may be viewed as a row of regions that is folded back along the associated inter-region interconnection conductors. Each region preferably includes a plurality of subregions of programmable logic. A typical subregion is programmable to perform any of several logical operations on a plurality of input signals applied to the subregion to produce an output signal of the subregion. Programmable logic connectors are associated with the regions for selectively bringing signals from the associated inter-region conductors into the region for use as inputs to the subregions in that region. Other programmable logic connectors selectively apply the subregion output signals to the associated inter-region conductors.

A plurality of horizontal inter-super-region interconnection conductors is associated with each row of super-regions for selectively conveying signals to, from, and between the super-regions in the associated row. Similarly, a plurality of vertical inter-super-region interconnection conductors is associated with each column of super-regions for selectively conveying signals to, from, and between the super-regions in the associated column. Programmable logic connectors are provided for selectively applying signals on the horizontal and vertical inter-super-region conductors to the inter-region conductors. Additional programmable logic connectors are provided for selectively applying subregion output signals to the horizontal and vertical inter-super-region conductors. And programmable logic connectors are provided for selectively interconnecting horizontal and vertical inter-super-region conductors.

The architectures of this invention can be made more uniform with respect to the horizontal and vertical axes of the device. These architectures therefore lend themselves more readily to square or nearly square layouts. This is desirable because such layouts have low aspect ratios of one or nearly one. It may also be possible to achieve greater logic densities with the architectures of this invention. The inter-super-region interconnection conductors provide a next level of routing hierarchy (beyond the routing provided at the region and super-region levels). Connectivity within the device is increased by segmenting (and thereby rendering reusable) wiring channels in aligned super-regions. Any necessary interconnections between super-regions are then made using inter-super-region conductors.

Other features that the programmable logic devices of this invention may have are the provision of two types of horizontal and/or vertical inter-super-region interconnection conductors. These are so-called "global" horizontal and/or vertical conductors that extend along the entire length of the associated row or column of super-regions, and so-called "half" horizontal and/or vertical conductors that extend along one of two mutually exclusive halves of the length of the associated row or column of super-regions. The mutual exclusivities mentioned in the preceding sentence are preferred but not absolutely required.

As a possible addition or alternative to providing separate global horizontal and half horizontal conductors, two axially aligned half horizontal conductors can be programmably "stitched" together to provide a global horizontal conductor when such a conductor is needed. Thus it may be possible to omit the dedicated global horizontal conductors. Or it may be preferred to have only global horizontal conductors and no half horizontal conductors. The same options exist with respect to the above-described global vertical and half vertical conductors. The design choices made with regard to the foregoing options may be influenced by the size of the device (e.g., the number of logic subregions, regions, and super-regions on the device).

If stitching of conductors is provided as mentioned in the preceding paragraph, it may be provided by programmable buffers between the conductors being stitched.

The above-mentioned programmable logic connectors for selectively bringing signals from the inter-region conductors into the region may include local conductors that are interleaved between horizontally adjacent regions. The local conductors may be of two types: (1) region-feeding conductors for bringing signals into the adjacent region or regions, and (2) local feedback conductors for making output signals of the region available as inputs to the region and possibly also horizontally adjacent regions. The region-feeding conductors are programmably connectable to the adjacent inter-region interconnection conductors in order to receive signals from the inter-region interconnection conductors.

The above-mentioned programmable logic connectors for (1) applying signals on the horizontal and vertical inter-super-region conductors to the inter-region conductors, (2) applying subregion output signals to the inter-super-region conductors, and (3) selectively interconnecting horizontal and vertical inter-super-region conductors may include drivers which are effectively shared for these various purposes. For example, one or more of these drivers may be associated with each logic subregion. Programmable logic connectors are provided for applying any of several signals to each driver. For example, these signals may include (1) one or more output signals of the associated subregion, (2) one or more global or half vertical conductor signals, and (3) one or more global or half horizontal conductor signals. The output signal of each driver may be programmably connected to (1) one or more global or half horizontal conductors, (2) one or more global or half vertical conductors, (3) one or more inter-region interconnection conductors, and (4) one or more local conductors. These drivers are therefore shared for many purposes such as (1) driving subregion output signals out onto the global and half conductors, as well as onto the inter-region interconnection conductors, (2) making connections between horizontal and vertical conductors, and (3) driving subregion output signals back onto local conductors.

Some of the programmable logic connectors feeding drivers as described in the preceding paragraph (e.g., those programmable logic connectors near the periphery of the device) may also receive signals from input/output ("I/O") pins of the device. This enables the associated drivers to also be used to drive signals from the I/O pins to the destinations mentioned above. Some I/O pins may also have dedicated drivers that programmably feed one or more global or half conductors and/or one or more inter-region interconnection conductors.

Each subregion is fed by multiple inputs. In architectures with local conductors interleaved between horizontally adjacent regions, some of these inputs come from the local conductors to the left of the region that includes that subregion, and some of these inputs come from the local conductors to the right of the region that includes that subregion.

I/O pins along the top, bottom, left, and right sides of the device may programmably select their output and/or output enable signals from one or more of the local conductors adjacent the respective top, bottom, left, or right side of the device.

From the foregoing it will be apparent that the region-feeding local conductors are preferably not directly connected to the global or half conductors. In order to reach a local line, these global or half conductor signals must first be routed through the above-mentioned drivers and also in most cases through inter-region interconnection conductors. This interconnection architecture reduces the number of programmable connections used to connect signals to the local lines.

Some devices may not have dedicated local feedback lines. This saves programmable interconnect which is wasted if the local feedback lines are not used. For these devices, the functionality of the local feedback lines can be achieved by routing signals to the region-feeding conductors (e.g., via the inter-region interconnection conductors). If this is done, it may be advantageous to make some of the inter-region interconnection conductors span only a very small number of the logic regions, while other inter-region interconnection conductors span larger numbers of the logic regions.

From the foregoing it will be seen that the interconnection resource architectures of this invention are hierarchical to an increased degree (e.g., from global or half global to inter-region to local). Such architectures help to reduce the area required for a programmable logic device with a given amount of logic capability by decreasing the total number of programmable interconnections required. Such architectures also help to increase the speed of the device by reducing the parasitic loading due to excessive numbers of programmable interconnections.

Further features of the invention, its nature and various advantages will be more apparent from the accompanying drawings and the following detailed description of the preferred embodiments.

DETAILED DESCRIPTION OF THE PREFERRED EMBODIMENTS

Various aspects of the invention will first be described with reference to embodiments of the type shown in FIGS. 1–4. Thereafter, some of these aspects will be further described with reference to embodiments of the type shown in FIGS. 5–8, which also show some additional possible aspects of the invention. Illustrative uses of the programmable logic devices of this invention are described with reference to FIGS. 9 and 10.

Figure 1:
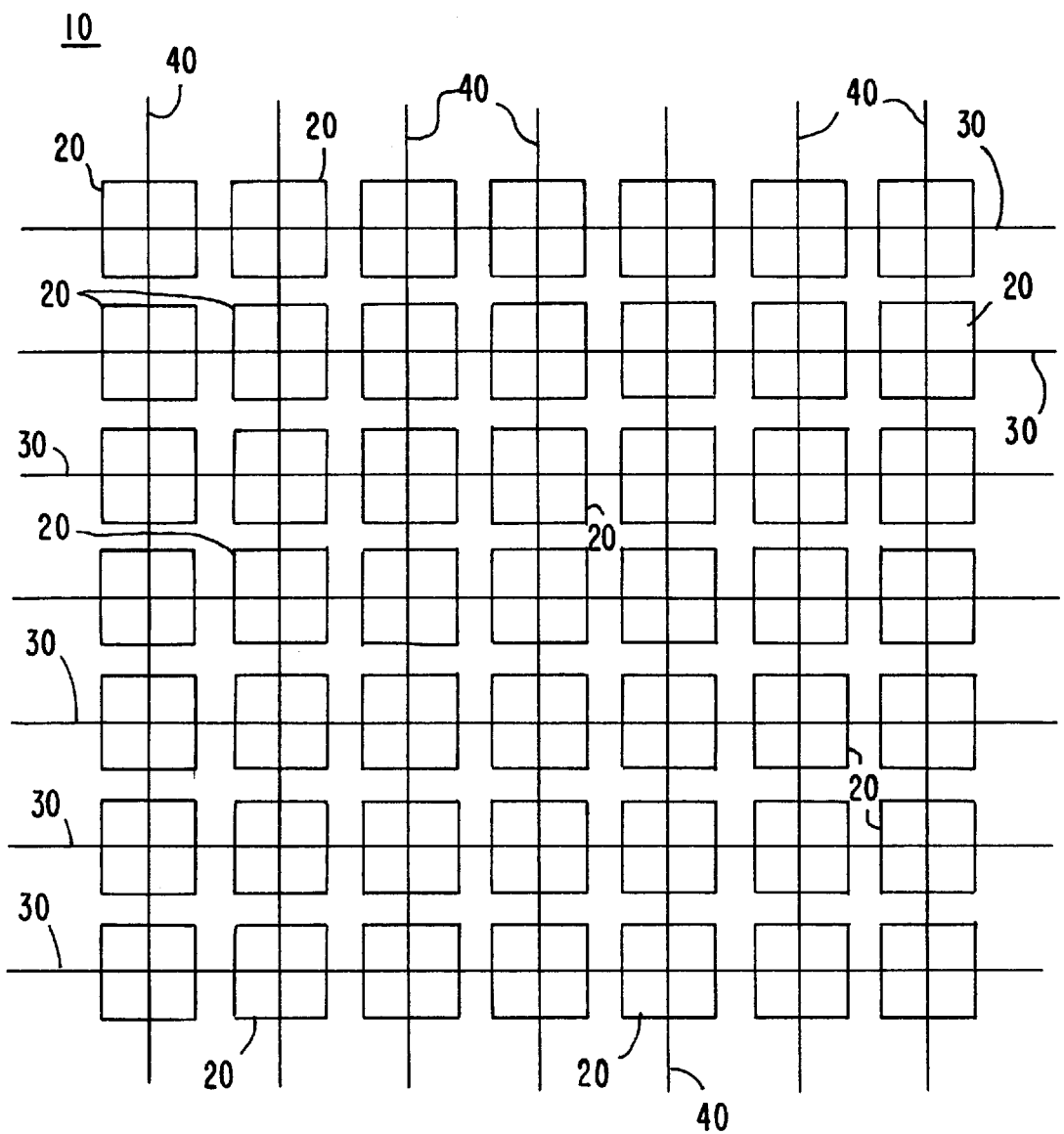
FIG. 1 is a simplified plan view of a portion of an illustrative embodiment of a programmable logic device constructed in accordance with the principles of this invention.

As shown in FIG. 1, an illustrative embodiment of a programmable logic array integrated circuit device 10 constructed in accordance with this invention includes a plurality of super-regions 20 of programmable logic disposed on the device in a two-dimensional array of intersecting rows and columns of super-regions. A plurality of horizontal inter-super-region interconnection conductors 30 is associated with each of the rows, and a plurality of vertical inter-super-region interconnection conductors 40 is associated with each of the columns. The preferred embodiments of the invention take advantage of recent developments in semiconductor fabrication, which allow an additional layer of metal to be provided, by using that additional layer to run conductors 30 and 40 over super-regions 20. This is one way in which the present invention can help increase logic density on device 10. The number of rows and columns (i.e., seven in each case) shown in FIG. 1 is merely illustrative, and any number of rows and columns can be provided as desired. Also, although not shown in FIG. 1, it will be understood that device 10 may additionally include input and/or output pins for connecting device 10 to external circuitry. Such input and/or output pins (generically referred to simply as input/output or I/O pins) may be disposed around the periphery of the device and may be programmably connectable to various ones of conductors 30 and 40. See also the techniques used for input/output connections in FIG. 6.

It will be understood that terms like "row" and "column", "horizontal" and "vertical", "left" and "right" , "upper" and "lower", and other directional or orientational terms are used herein only for convenience, and that no fixed or absolute directions or orientations are intended by the use of these terms. For example, the words in each of the word pairs mentioned above can be reversed if desired.

Figure 2:
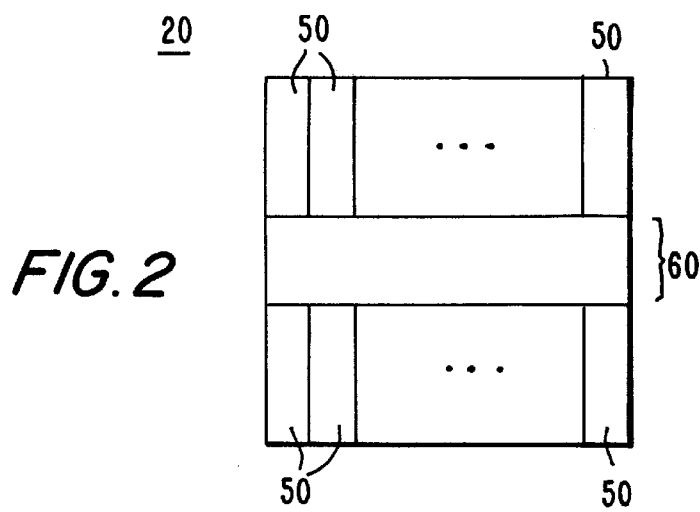
FIG. 2 is a somewhat more detailed, but still simplified, plan view of an illustrative embodiment of a representative portion of the FIG. 1 apparatus in accordance with this invention.

An illustrative embodiment of a representative super-region 20 is shown in more detail in FIG. 2. In the FIG. 2 embodiment, super-region 20 includes two rows of regions 50 of programmable logic disposed on respective opposite sides of a plurality of horizontal inter-region interconnection conductors 60. For example, super-region 20 may include eight regions 50 on each side of conductors 60. This embodiment of super-region 20 is therefore somewhat like a row of 16 regions 50 that has been folded in half, back on itself, with the associated interconnection conductors 60 between the two halves of the row.

Figure 3:
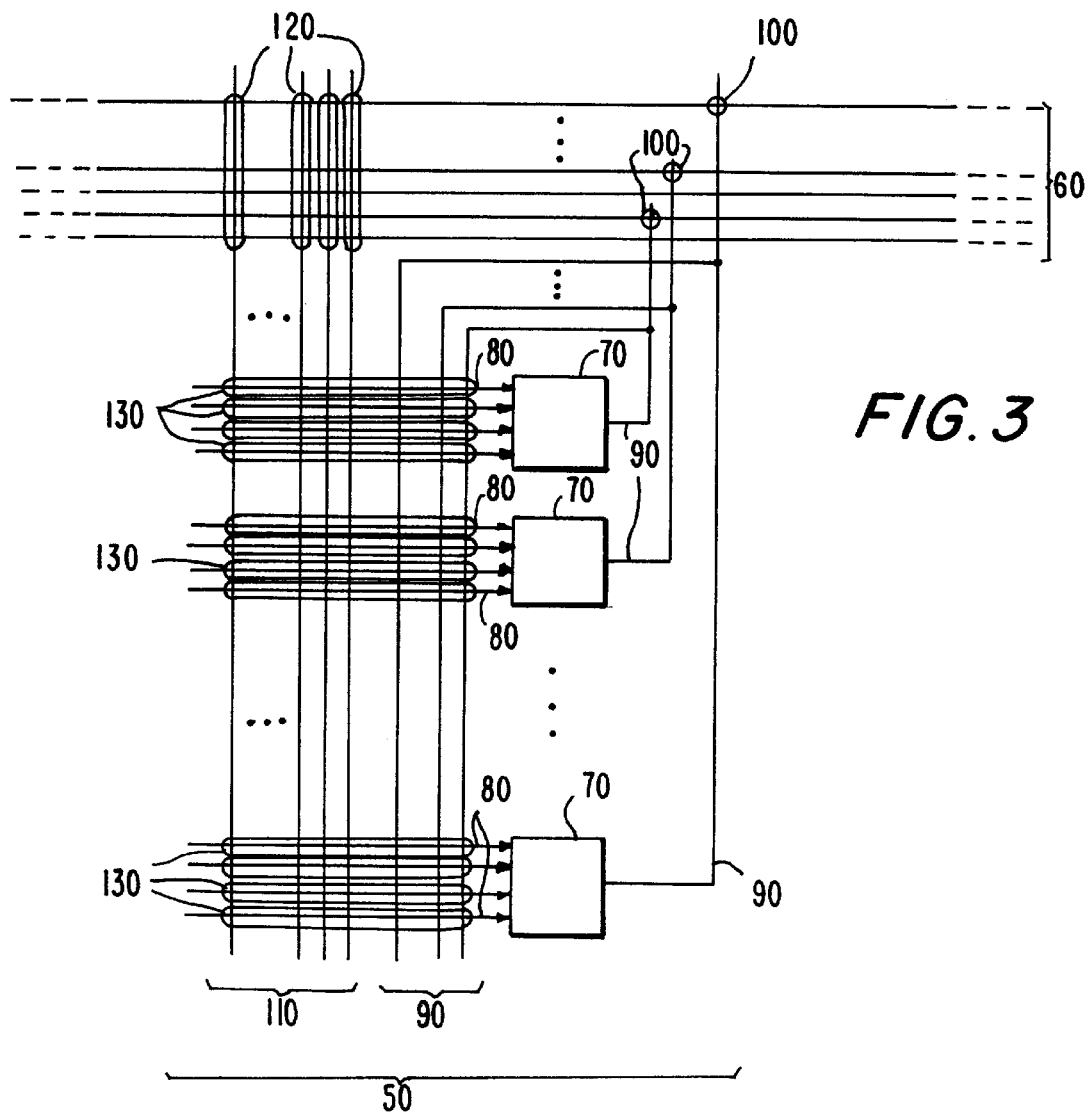
FIG. 3 is an even more detailed, but still simplified plan view of an illustrative embodiment of a representative portion of the FIG. 2 apparatus in accordance with this invention.

An illustrative embodiment of a representative region 50 is shown in more detail in FIG. 3. In the FIG. 3 embodiment, region 50 includes a plurality of subregions 70 of programmable logic. For example, region 50 may include eight subregions 70. Each subregion 70 is programmable to perform any of a plurality of logic functions on input signals 80 applied to the subregion. For example, each subregion 70 may include a programmable four-input look-up table for producing a look-up table output which is any logical combination of the four inputs 80 applied to the subregion. Each region 70 may additionally include a register and programmable switches for allowing the look-up table output to be selectively registered by the register. The output 90 of the subregion may then be either the registered or unregistered look-up table output. The outputs 90 of the subregions are selectively applied to inter-region conductors 60 via programmable logic connectors ("PLCs") 100. Although only one PLC 100 connection to a conductor 60 is shown for each output 90 in FIG. 3, it will be understood that each output 90 may have such connections to more than one of conductors 60, if desired. Each output 90 is also fed back within region 50 so that it can be used as an input to any of the subregions 70 in that region.

Each region 50 also includes a plurality of region-feeding conductors 110 for selectively bringing signals from inter-region conductors 60 into the region. PLCs 120 programmably connect conductors 60 to conductors 110 for this purpose. PLCs 120 may be only partially populated with possible connections (i.e., each of conductors 110 may be programmably connectable to only a subset of conductors 60). However, the population densities and distributions are preferably such that each conductor 60 has several possible ways into region 50 via conductors 110.

PLCs 130 allow the signals on conductors 110 and 90 to be programmably selectively applied to subregion inputs 80. PLCs 130 may be fully populated or partially populated, as desired. Again, however, if PLCs 130 are only partially populated, the population densities and distributions are preferably such that each conductor 90 and 110 has a least a couple of ways into each subregion 70 via conductors 80.

From the foregoing it will be seen that within a super-region 20 the regions communicate with one another via the inter-region conductors 60 of that super-region.

Figure 8:
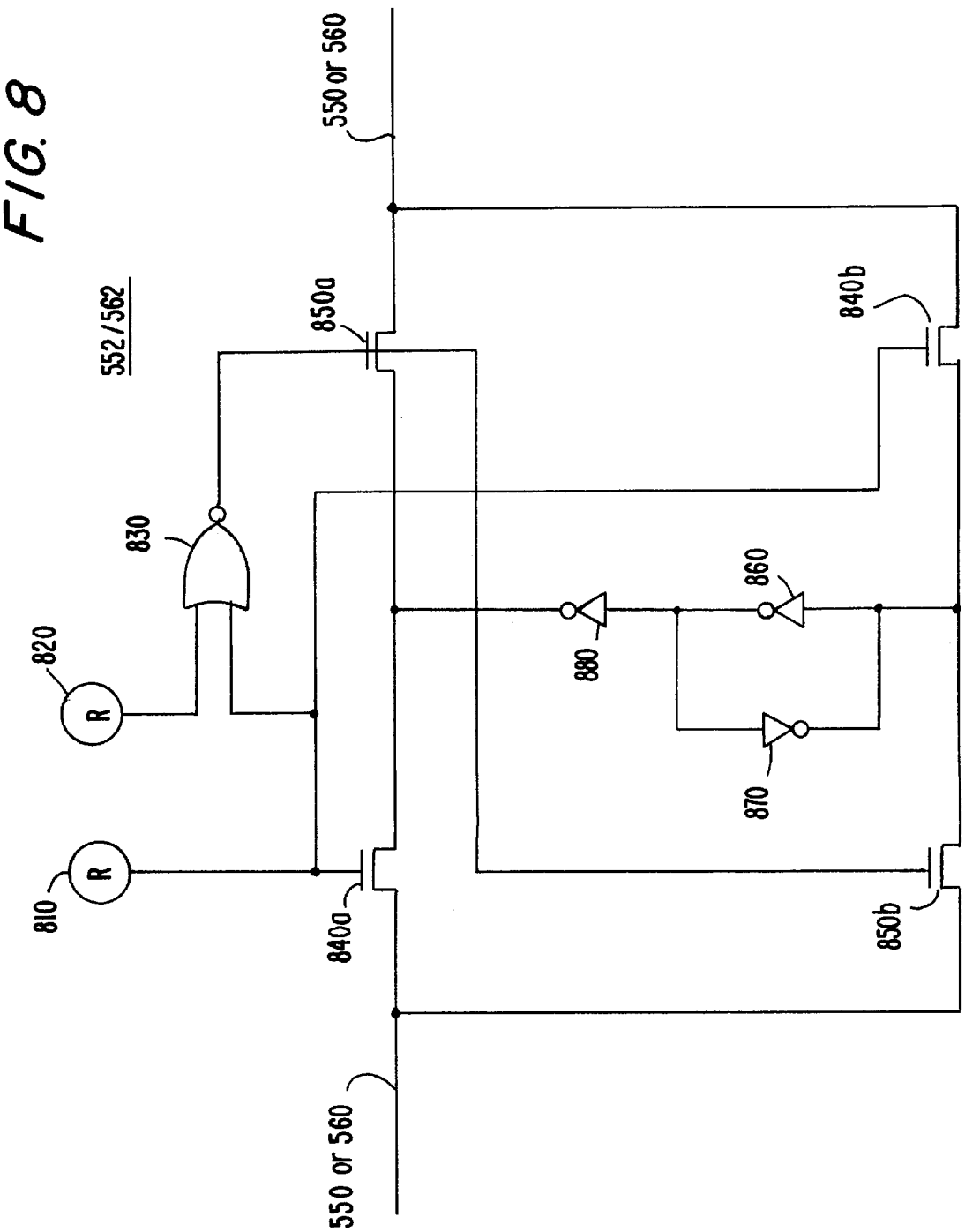
FIG. 8 is a schematic block diagram of an illustrative embodiment of circuitry that may be used in programmable logic devices in accordance with this invention.

The illustrative region structure shown in FIG. 3 is generally like the corresponding portion of the structure shown in above-mentioned Cliff et al. U.S. Pat. No. 5,689,195 (see especially FIG. 3 of that patent). However, FIG. 3 is somewhat simplified as compared to the Cliff et al. FIG. It will be understood that, if desired, additional features from the Cliff et al. structure can be included in regions provided in devices of the present invention. Examples of such possible other features are additional conductors for so-called fast lines and/or clock signals, carry and/or cascade interconnections between subregions 70, register control signals derived from local conductors such as 90 and/or 110, etc. The detailed structure of subregions 70 can be as shown in FIG. 8 of the same Cliff et al. reference. Alternatively, subregions 70 can be constructed entirely differently (e.g., as product term logic). Similarly, regions 50 can have a different construction from what is shown in FIG. 3 and described above. For example, some of the features shown in McClintock et al. U.S. Pat. No. 5,543,732, McClintock et al. U.S. Pat. No. 5,614,840, Cliff et al. U.S. Pat. No. 5,541,530, Leong et al. U.S. Pat. No. 5,592,106, Reddy et al. U.S. Pat. No. 5,694,058, Pedersen U.S. Pat. No. 5,872,463, and Cliff et al. U.S. Pat. No. 5,909,126 can be employed if desired. These additional references are also hereby incorporated by reference herein.

Figure 4:
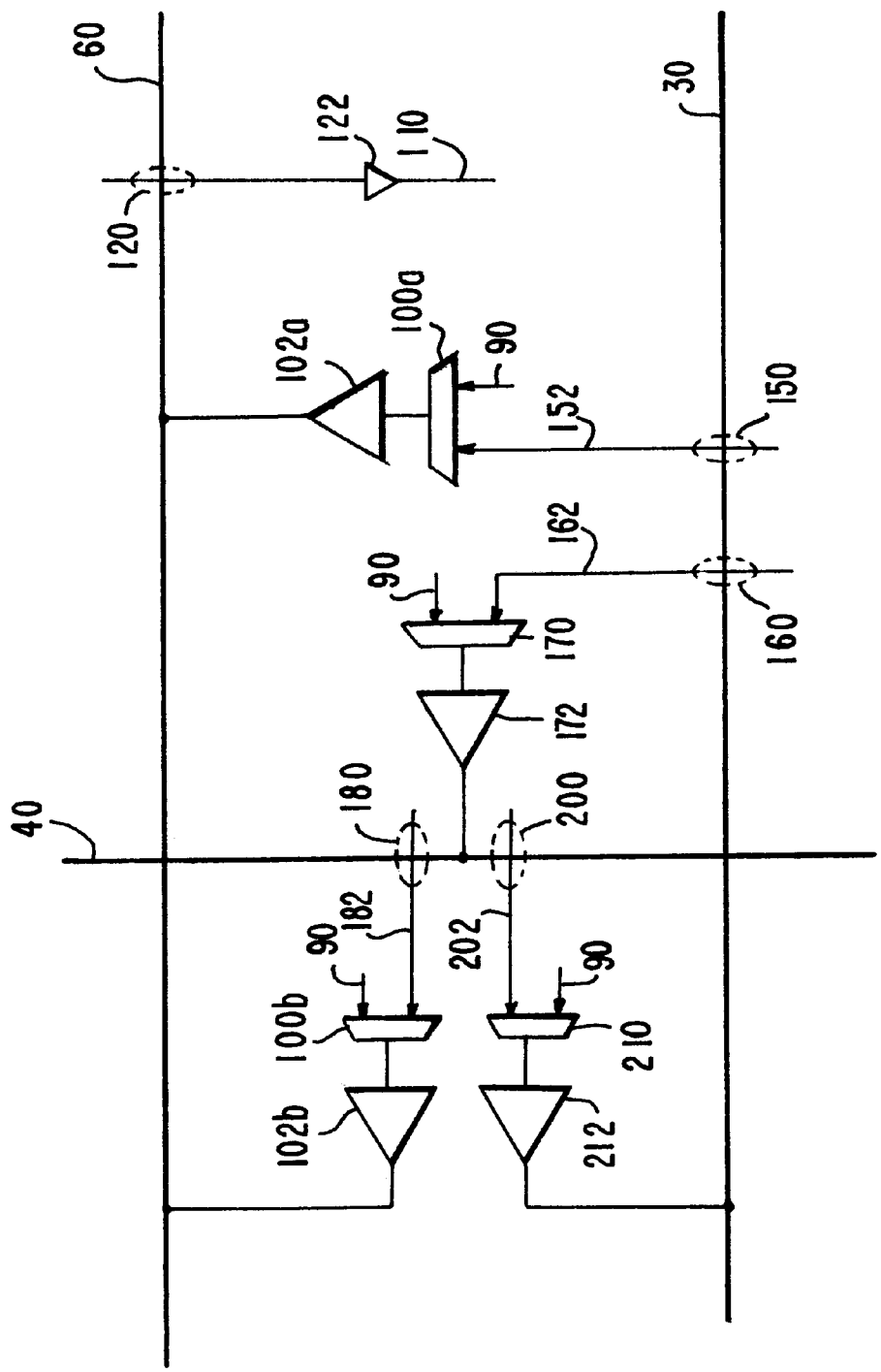
FIG. 4 is a more detailed, but still simplified, schematic block diagram of an illustrative embodiment of a representative portion of the FIG. 1 apparatus in accordance with this invention.

FIG. 4 shows an illustrative embodiment of the interconnections between a representative super-region 20 and the horizontal and vertical inter-super-region interconnection conductors 30 and 40 that are associated with the row and column that include that super-region. It will be understood that each of the circuit paths shown in FIG. 4 is only representative of several similar circuit paths. For example, although only one PLC 100a and associated structures 90, 150, 152, and 102a are shown in FIG. 4, multiple groups of such elements are in fact associated with each super-region 20. The same is true for PLCs 100b, 170, and 210 and their associated elements.

Subregion output signals 90 are applied to certain inputs of PLCs 100a, 100b, 170, and 210. (PLCs 100a and 100b may be subsets of PLCs 100 in FIG. 3.) Signals from horizontal inter-super-region conductors 30 can be applied to other inputs of PLCs 100a by PLCs 150 and conductors 152. PLCs 100a select from among the signals they receive and apply the selected signals to conductors 60 via drivers 102. In this way signals on horizontal inter-super-region conductors 30 can be selectively brought into the super-region.

Signals from vertical inter-super-region conductors 40 can be applied to other inputs of PLCs 100b by PLCs 180 and conductors 182. PLCs 100b select from among the signals they receive and apply the selected signals to conductors 60 via drivers 102b. In this way signals on vertical inter-super-region conductors 40 can be selectively brought into the super-region.

Signals from horizontal inter-super-region conductors 30 can be applied to other inputs of PLCs 170 by PLCs 160 and conductors 162. PLCs 170 can select these horizontal inter-super-region conductor signals or subregion output signals 90 for application to vertical inter-super-region conductors 40 via drivers 172. Elements 160, 170, and 172 therefore allow signals on horizontal conductors 30 to be applied to vertical conductors 40. Elements 170 and 172 additionally allow subregion outputs 90 to be applied to vertical conductors 40.

Signals from vertical inter-super-region conductors 40 can be applied to other inputs of PLCs 210 by PLCs 200 and conductors 202. PLCs 210 can select these horizontal inter-super-region conductor signals or subregion output signals 90 for application to horizontal inter-super-region conductors 30 via drivers 212. Elements 200, 210, and 212 therefore allow signals on vertical conductors 40 to be applied to horizontal conductors 30. Elements 210 and 212 additionally allow subregion outputs 90 to be applied to horizontal conductors 30.

FIG. 4 also shows PLCs 120 and drivers 122 for selectively driving signals on region interconnection conductors 60 into the regions of the super-region (as in FIG. 3).

As described above for PLCs 120, PLCs 150, 160, 180, and 200 may have full or partial populations of programmable connections from their respective input conductors 30 and 40 to their respective output conductors 152, 162, 182, and 202. If partial populations are used, the densities and distributions of the programmable connections are preferably such that each input conductor 30 or 40 has several ways to get to PLCs 100a, 100b, 170, and 210.

Drivers 102a, 102b, 172, and 212 are preferably programmably controlled tri-state drivers so that more than one such driver can be connected to a conductor 30, 40, or 60. Only one of the drivers connected to a conductor will typically be active; the other drivers will be tri-stated. Alternatively, all of the drivers 172 and 212 connected to a conductor 30 or 40 may be tri-stated, and the conductor may be used for another purpose (e.g., bringing a signal into the device from an input/output pin of the device).

The output signals of drivers 102a, 102b, 172, and 212 are shown in FIG. 4 as having fixed (i.e., non-programmable) connections to conductors 30, 40, and 60. This implies that each driver 102a, 102b, 172, and 212 has a fixed output connection to one particular conductor 30, 40, and 60. It will be understood, however, that as an alternative to this construction each driver 102a, 102b, 172, and/or 212 could have programmable connections to one or more of the associated conductors 30, 40, and 60.

The subregion output signals 90 shown in FIG. 4 can come directly from particular subregion outputs 90 shown in FIG. 3. Alternatively, there may be programmable switching between the subregion outputs 90 shown in FIG. 3 and the inputs 90 shown in FIG. 4 so that each input 90 in FIG. 4 can be selected from among several outputs 90 of the type shown in FIG. 3.

From the foregoing it will be seen that devices of this invention can be constructed with no significant preferences for communication via horizontal conductors 30 as opposed to vertical conductors 40 or vice versa. For example, there can be the same number of horizontal conductors 30 for each row as there are vertical conductors 40 for each column. There can be the same number of routes of each kind via PLCs 102a as there are via PLCs 102b. There can be the same number of routes of each kind via PLCs 172 as there are via PLCs 210. There is therefore no preference for communication either horizontally or vertically, and if the device is made with approximately the same number of rows and columns, it can be substantially the same in either direction at the level of communication between the super-regions. Devices of this invention can accordingly have the advantage that they are not merely rows of programmable logic that are repeated to make two-dimensional arrays. Rather, they can be truly isomorphic in both directions for purposes of inter-super-region communication. And with the same or approximately the same numbers of rows and columns, devices of this invention can have advantageously low aspect ratios of one or nearly one.

Figure 5:
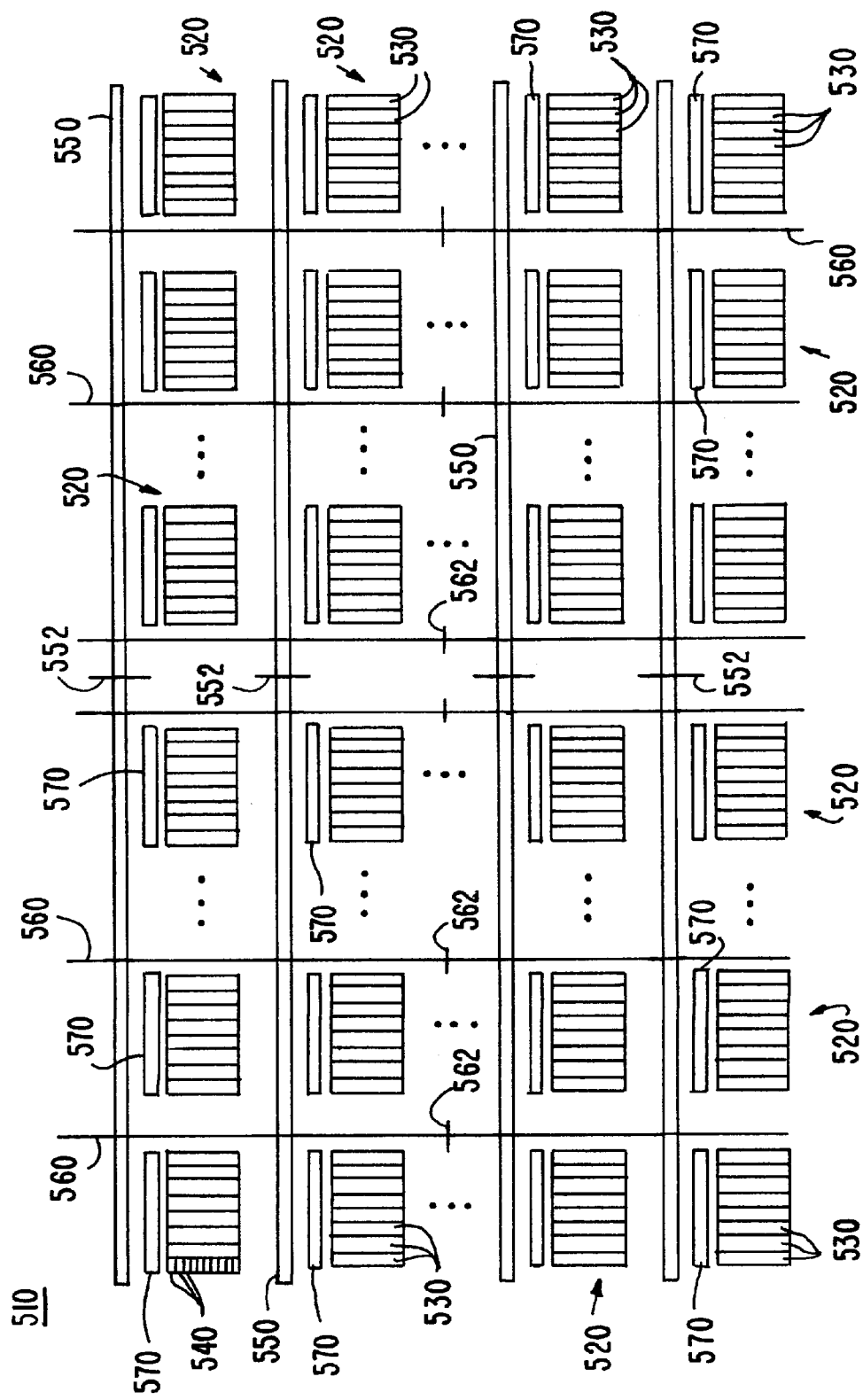
FIG. 5 is a simplified block diagram of representative portions of another illustrative embodiment of a programmable logic device constructed in accordance with the invention.

The alternative illustrative programmable logic integrated circuit device 510 shown in FIG. 5 includes several rows and several columns of super-regions 520 of programmable logic. For example, there may be 20 rows and ten columns of super-regions 520 on device 510.

Each super-region 520 includes several regions 530 of programmable logic. For example, each super-region 520 may include eight regions 530.

Each region 530 includes several subregions 540 of programmable logic. For example, each region 530 may include ten subregions 540. To avoid undue clutter in FIG. 5, the subregions 540 are shown individually in only the extreme upper left-hand region 530.

Each subregion 540 is typically programmable to perform any of several relatively elementary logic operations on input signals applied to that subregion. For example, each subregion 540 may include a four-input look-up table which is programmable to provide any logical combination of four input signals applied to that subregion. Each subregion 540 may also include a register and associated PLCs for selectively registering the output signal of the look-up table.

A plurality of horizontal inter-super-region interconnection conductors 550 is associated with each row of super-regions 520. Each group of conductors 550 may include global horizontal conductors (which extend along the entire length of the associated row of super-regions 520) and half horizontal conductors (which extend along respective left or right halves of the associated row of super-regions 520). Axially aligned half horizontal conductors 550 may be programmably interconnected by PLCs 552 to effectively make a global horizontal conductor 550. Depending on such factors as the size of device 510, dedicated global horizontal conductors may be omitted and sole reliance placed on interconnecting axially aligned half horizontal conductors 550 when a global horizontal conductor is needed. As another alternative, all of conductors 550 may be global and the half horizontal conductors may be omitted.

A plurality of vertical inter-super-region interconnection conductors 560 is associated with each column of super-regions 520. Like each group of horizontal conductors 550, each group of vertical conductors 560 may include global vertical conductors (extending along the entire length of the associated column), or half vertical conductors (extending along respective top or bottom halves of the associated column), or both global and half vertical conductors. Axially aligned half vertical conductors 560 may be programmably interconnected by PLCs 562 between those conductors. Although FIG. 5 shows the vertical conductors 560 associated with each column of super-regions 520 collected together in a single group, it may be preferable to distribute the vertical conductors 570 for each column among the regions 530 in that column as shown in FIG. 6.

Each super-region 520 has an associated plurality of inter-region interconnection conductors 570 that extend along the regions 530 in that super-region. Conductors 570 are frequently referred to below as "fractional horizontal" or simply "fractional" conductors.

Figure 6:
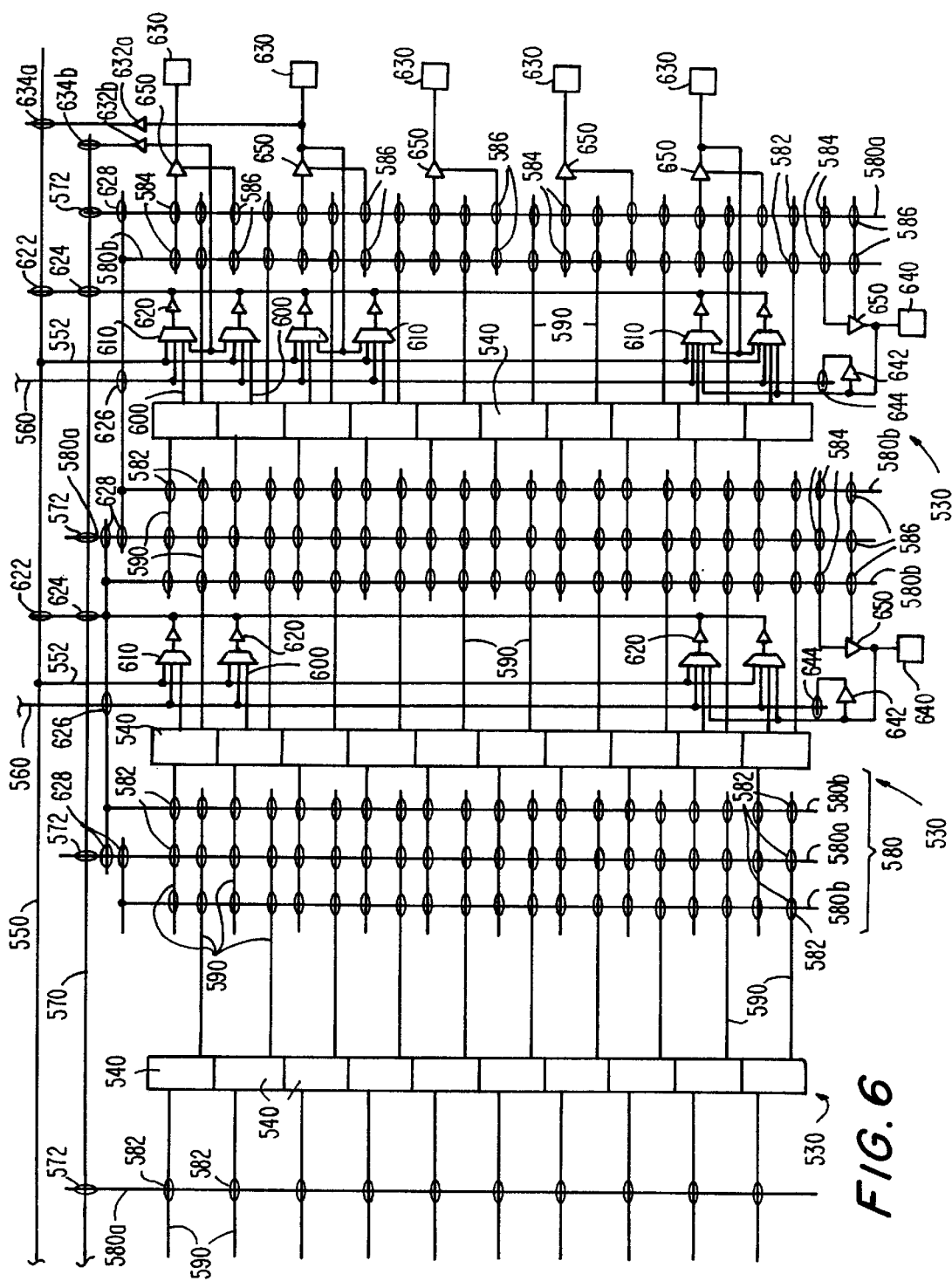
FIG. 6 is a more detailed, but still simplified, schematic block diagram of a representative portion of FIG. 5.

A representative portion of device 510 is shown in more detail in FIG. 6. In particular, FIG. 6 shows the lower right-hand corner of device 510. The greatest amount of detail is shown toward the right in FIG. 6. Some of that detail is omitted toward the left. FIG. 6 shows that regions 530 are interspersed with local conductors 580. These are of two types: (1) region-feeding conductors 580a and (2) local feedback conductors 580b. The region-feeding conductors 580a on each side of each region 530 are programmably connectable by PLCs 572 to the fractional conductors 570 associated with the super-region 520 that includes that region in order to bring signals from the fractional conductors 570 into the adjacent regions. Each subregion 540 has several main input conductors 590, some of which come from the left and some of which come from the right. For example, each subregion 540 may have four input conductors 590, two from the left and two from the right. Each of conductors 590 is programmably connectable by PLCs 582 to the local conductors 580 to the left or right of the associated subregion 540, depending on the direction from which that conductor 590 comes to the subregion.

Each subregion 540 has at least one main output conductor 600. (In connection with less crowded FIG. 7 it will be explained that each subregion 540 preferably has more than one output. But for present purposes it will suffice to show and describe one representative main output conductor 600.) At least one PLC 610 is associated with each subregion output conductor 600. The signal on the subregion output conductor 600 is applied to one input terminal of the associated PLC 610. Other inputs to each PLC 610 are (1) signals from several adjacent global horizontal and half horizontal conductors 550 (brought into the associated region via lateral conductors 552), and (2) signals from several adjacent global vertical and half vertical conductors 560. PLCs 610 that are adjacent to horizontal or vertical I/O pins 630 and/or 640 may also have as inputs signals from those I/O pins. In the simplest case each PLC 610 is programmable to select one of its inputs as its output. The output of each PLC 610 is applied to an associated driver 620.

The output of each driver 620 can be applied to (1) one or more adjacent global or half horizontal conductors 550 (via PLCs 622), (2) one or more adjacent fractional horizontal conductors 570 (via PLCs 624), (3) one or more adjacent global or half vertical conductors 560 (via PLCs 626), (4) one or more adjacent region-feeding conductors 580a (via PLCs 628), and/or (5) local feedback conductors 580b.

From the foregoing it will be seen that in addition to providing the paths by which subregion output signals 600 are driven out to conductors 550, 560, 570, and 580, PLCs 610 and drivers 620 provide the paths by which conductors 550 and 560 can be interconnected, and the paths by which signals on conductors 550 and 560 are brought into the super-regions 520. For the most part this last-mentioned routing involves communication to the fractional horizontal conductors 570 of each super-region and from the fractional horizontal conductors to the region-feeding conductors 580a of each region (although it may occasionally be possible to route a signal from a conductor 550 or 560 more directly to a region 530 via the local conductors 580 of that region without making use of the adjacent conductors 570). This method of routing reduces the number of programmable connections used to connect signals to region-feeding conductors 580a. In effect, conductors 550 and 560 provide communication between super-regions 520, while the conductors 570 associated with each super-region provide most of the communication between the regions 530 in that super-region. Local conductors 580 (especially local feedback conductors 580b) provide most of the communication between the subregions 540 adjacent to those conductors 580.

It will be noted that interleaving local conductors 580 between horizontally adjacent regions 530 provides additional local signal routing between the subregions 540 in horizontally adjacent regions 530. For example, the output signal 600 of a subregion 540 in the middle region 530 shown in FIG. 6 can be applied as an input to a subregion 540 in the right-hand region 530 using only a local conductor 580 and without the need to use a fractional horizontal conductor 570.

Local conductors 580 adjacent the edges of device 510 are used as the sources for the output data and output enable signals of I/O pins 630 and 640. PLCs 584 select the output data signals, and PLCs 586 select the output enable signals. Each output data signal is applied to the data input terminal of an associated tri-state driver 650, and each output enable signal is applied to the control input terminal of an associated tri-state driver 650.

FIG. 6 shows that some of I/O pins 630 and 640 may have dedicated drivers 632a, 632b, 642 that programmably feed one or more conductors 550, 570, and 560 via PLCs 634a, 634b, and 644, respectively.

Figure 7:
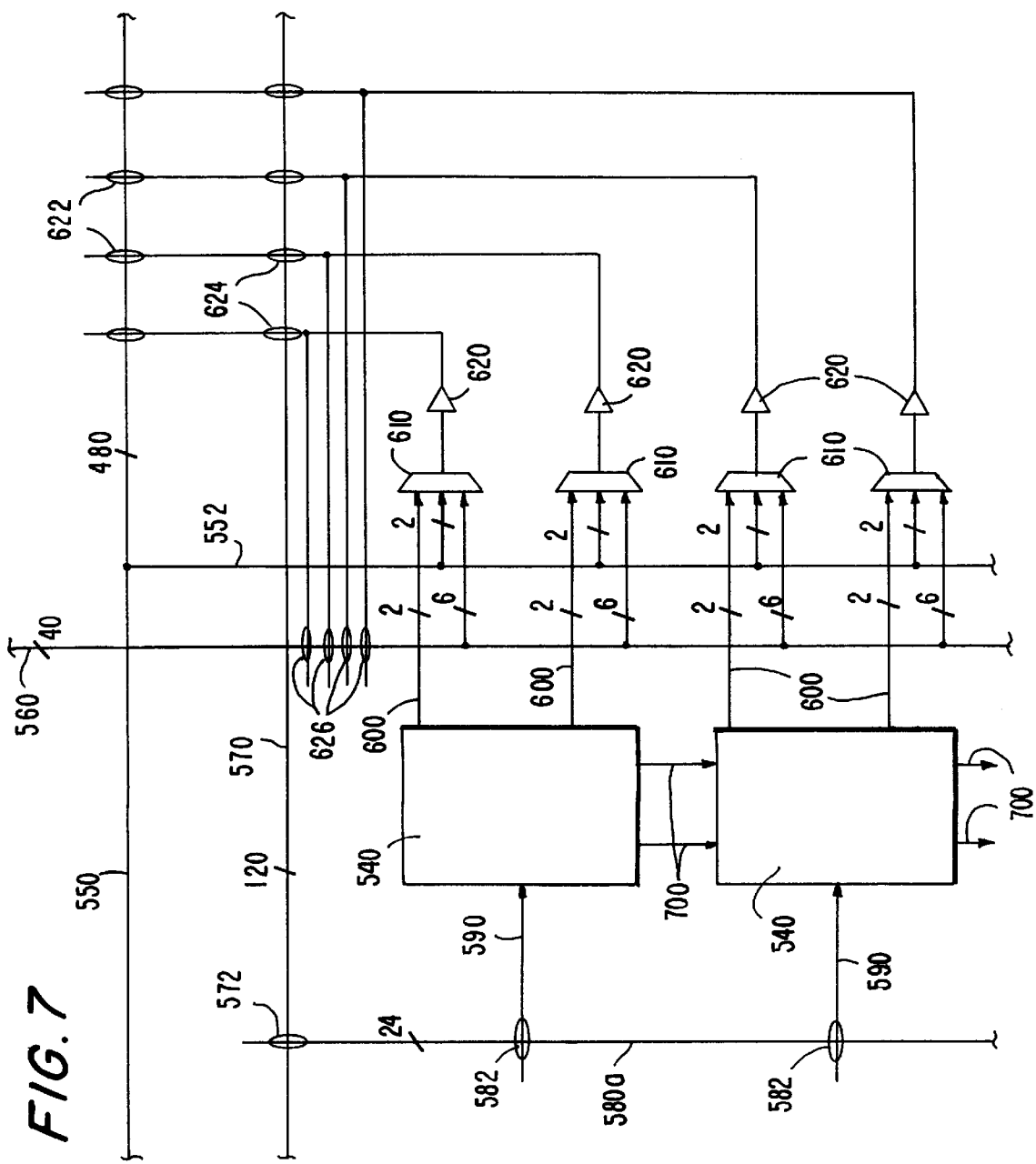
FIG. 7 shows a representative portion of FIG. 6 in still more detail, but with some modifications in accordance with this invention.

FIG. 7 shows a representative portion of FIG. 6 in still more detail. However, FIG. 7 also shows that some of the interconnection resources that are included in FIG. 6 can be omitted and their functions performed by other interconnection resources as will now be explained.

FIG. 7 shows that each subregion 540 may have more than one main output 600. For example, each of PLCs 610 in FIG. 7 is shown as receiving both the registered and combinatorial output signals of the associated subregion 540, and there are two such PLCs 610 associated with each subregion. The other inputs to each PLC 610 are as described above in connection with FIG. 6. Although FIGS. 6 and 7 show each PLC 610 receiving inputs 600 from only one subregion 540, this is not necessarily the case, and each PLC 610 could instead receive inputs 600 from two or more subregions 540 if desired.

In the embodiment shown in FIG. 7 drivers 620 drive only to conductors 550 (via PLCs 622), conductors 560 (via PLCs 626), and conductors 570 (via PLCs 624). Drivers 620 do not have direct connections to region-feeding conductors 580a, and local feedback conductors 580b are entirely omitted. Conductors 580a therefore serve for both region-feeding and local feedback. Moreover all region-feeding and local feedback signals must also pass through fractional horizontal conductors 570. Because of the greater number of uses to which conductors 570 are put in this embodiment, it may be desirable to axially segment some of conductors 570. Each axial segment of such a conductor 570 would extend to only a small number of regions 530 (e.g., one or two regions 530), while the unsegmented conductors 570 would extend to all the regions 530 in the associated super-region 520. Eliminating dedicated local feedback conductors 580b as shown in FIG. 7 saves substantial amounts of local interconnect when local feedback is not needed.

FIG. 7 also shows that in addition to main outputs 600, each subregion 540 may have one or more direct connections 700 to adjacent subregions. For example, one of direct connections 700 may be usable for an arithmetic carry out signal from one subregion to another. Another of direct connections 700 may be usable for a cascade connection from one subregion to another. Above-mentioned Cliff et al. U.S. Pat. No. 5,689,195 is exemplary of how carry and cascade connections may be provided and used in programmable logic devices.

A typical device may include 20 rows of super-regions 520, with each row having 80 regions 530. Each region 530 may have ten subregions 540. Each row may have 480 half horizontal conductors 550 for each half of the row. The device may have a total of 6400 half vertical conductors 560 (40 for each half of each column of regions 530). A device of this size may not need global horizontal or global vertical conductors. Each super-region 520 may be spanned by 120 fractional horizontal conductors 570. Each of these conductors may be programmably connected to two of the region-feeding conductors 580a in each group of conductors 580a that it spans. Each group of local lines 580 may include 24 region-feeding conductors 580a and ten local feedback conductors 580b. There may be two drivers 620 per subregion 540. Each of drivers 620 may feed two half horizontal conductors 550, three fractional horizontal conductors 570, and one half vertical conductor 560. Each PLC 610 may be fed by two half vertical conductors 560, six half horizontal conductors 550, and two subregion outputs 600. As has been mentioned in connection with FIG. 6, some of PLCs 610 may also be fed by an I/O pin 630 and/or 640, with each I/O pin typically feeding four different PLCs 610. A typical device 510 may have 480 I/O pins 630 and 640.

It will be understood that the foregoing device size, numbers of interconnection conductors, numbers of PLCs, etc., are only illustrative, and that other sizes and numbers can be used if desired.

FIG. 8 shows an illustrative embodiment of a preferred bi-directional buffering circuit 552/562 in accordance with this invention. As the reference number 552/562 suggests, this circuit can be used for programmably connecting two half horizontal conductors 550 as shown at 552 in FIG. 5, or for programmably connecting two vertical conductors 560 as shown at 562 in FIG. 5.

Programmable function control element ("FCE") 810 controls the direction of buffering (i.e., whether from the left-hand conductor 550 or 560 to the right-hand conductor 550 or 560 or vice versa). FCE 820 controls segmentation (i.e., whether or not the left-and right-hand conductors 550 and 560 are connected to one another). If FCE 810 is programmed logic 0 and FCE 820 is programmed logic 1, the output of NOR gate 830 is logic 0 and all of transistors 840 and 850 are off, thereby disconnecting the left- and right-hand segments of conductor 550 or 560 from one another. On the other hand, if both of FCEs 810 and 820 are programmed logic 0, then the output of NOR gate 830 is logic 1 and both of transistors 840 are off while both of transistors 850 are on. This allows the signal on left-hand conductor segment 550 or 560 to flow through transistor 850b, to be amplified by serially connected inverting drivers 860 and 880, and to then be applied to the right-hand conductor segment 550 or 560 via transistor 850a. Inverter 870 is a small level-corrector for the circuit. Various forms of the word "amplify" are sometimes used herein and in the appended claims to refer to the signal strengthening and restoration that is performed by buffering circuit elements such as 860 and 880.

If FCE 810 is programmed logic 1 and FCE 820 is programmed logic 0, the output of NOR gate 830 is logic 0 and transistors 840 are on while transistors 850 are off. This allows the signal on right-hand conductor segment 550 or 560 to flow through transistor 840b, to be amplified by drivers 860 and 880, and to be applied to the left-hand conductor segment 550 or 560 via transistor 840a.

Programming both of FCEs 810 and 820 logic 1 produces the same condition as programming FCE 810 logic 1 and programming FCE 820 logic 0.

From the foregoing, it will be seen that circuit 552/562 is programmable to either (1) electrically isolate the left- and right-hand conductor segments 550 or 560 from one another, (2) cause the left-hand conductor segment 550 or 560 to drive the right-hand segment via buffering circuit elements 860 and 880, or (3) cause the right-hand conductor segment 550 or 560 to drive the left-hand segment via the buffering circuit elements.

Among the advantages of using programmable segmentation buffer circuitry of the type shown in FIG. 8 is that cutting off an unused conductor segment conserves power that would otherwise be wasted to drive the entire line. Such circuitry also facilitates scaling of programmable logic device architectures by providing a way of buffering long interconnection conductors. Segmentation and buffering reduces the load seen by the drivers (such as 620) driving the segmented and buffered conductors. This allows driver size and power to be reduced. Segmentation and buffering also improves timing for both corner-to-corner and same quadrant paths, and it improves fitting of logic into programmable logic devices by segmenting global conductors. Circuit 552/562 can be used for segmentation and buffering of conductors of any kind and length, not just the half horizontal and half vertical conductors that are specifically mentioned above.

Figure 9:
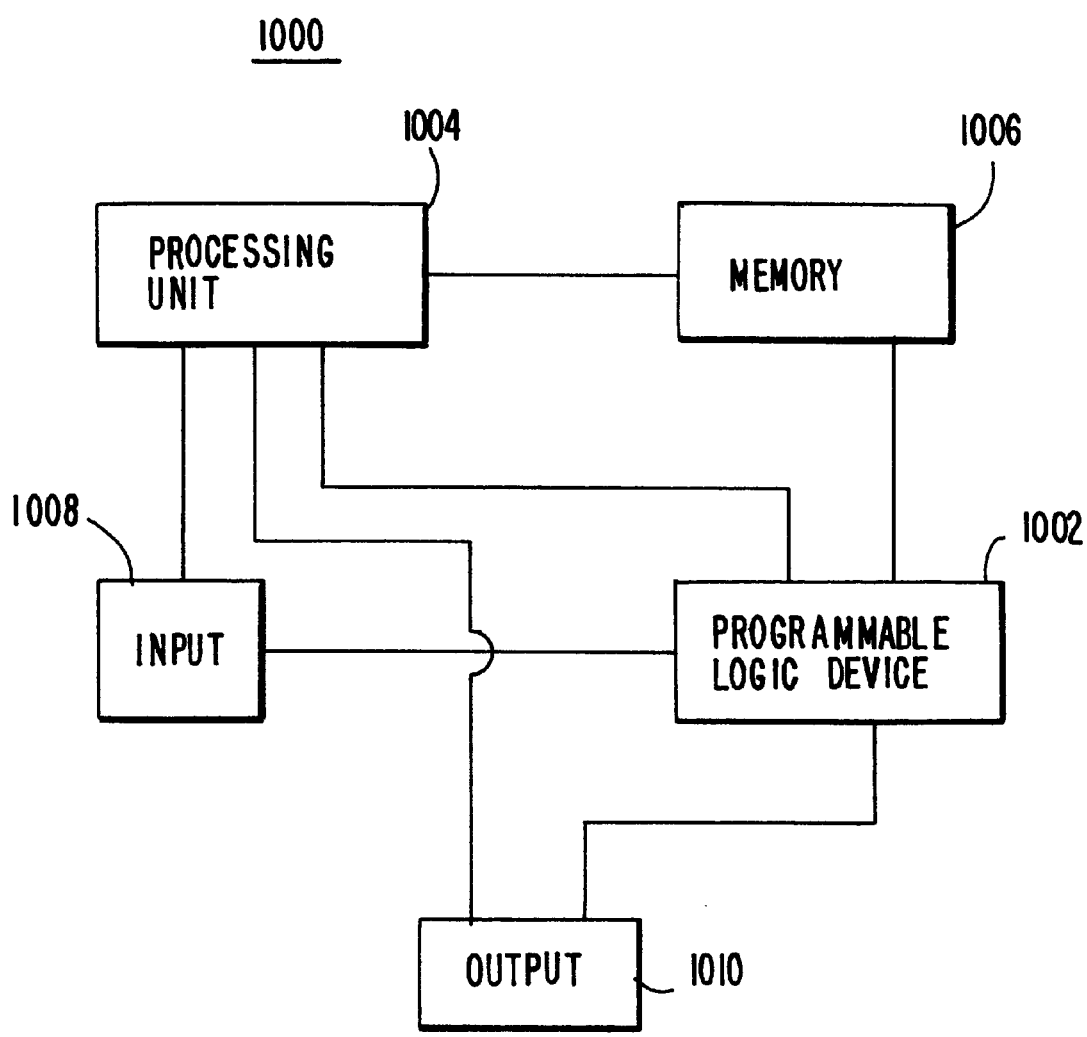
FIG. 9 is a simplified block diagram showing an illustrative use of programmable logic devices in accordance with this invention.

Those skilled in the art will appreciate that the programmable logic devices of this invention have many possible uses. For example, FIG. 9 illustrates use of a programmable logic device 1002 of this invention in a digital processing system 1000 including other digital components such as processing unit 1004, memory 1006, input device or circuitry 1008, and output device or circuitry 1010. System 1000 may be any computer or computer-like system with the addition of programmable logic device 1002 to perform any desired functions of or for the system. For example, programmable logic device 1002 may be programmed from memory 1006 under the control of processing unit 1004. Thereafter, programmable logic device 1002 may operate under the control of processing unit 1004 on data or other signals supplied from processing unit 1004, memory 1006, and/or input 1008 in order to produce output data or other signals that are applied to processing unit 1004, memory 1006, and/or output 1010. Processing unit 1004 may be a general-purpose processor (e.g., a microprocessor), as is typical if processor 1004 is the processor of a general-purpose computer system that includes programmable logic device 1002. Alternatively, processing unit 1004 may be any special-purpose circuitry for performing or controlling any particular functions or tasks. The various components and interconnections shown in FIG. 5 are only illustrative. Various ones of these components and interconnections can be omitted if desired. Similarly, additional components and interconnections can be included if desired. For example, input 1008 and output 1010 could be combined into one input/output device or circuit. Any suitable technologies can be used for any of components 1004, 1006, 1008, and 1010.

Figure 10:
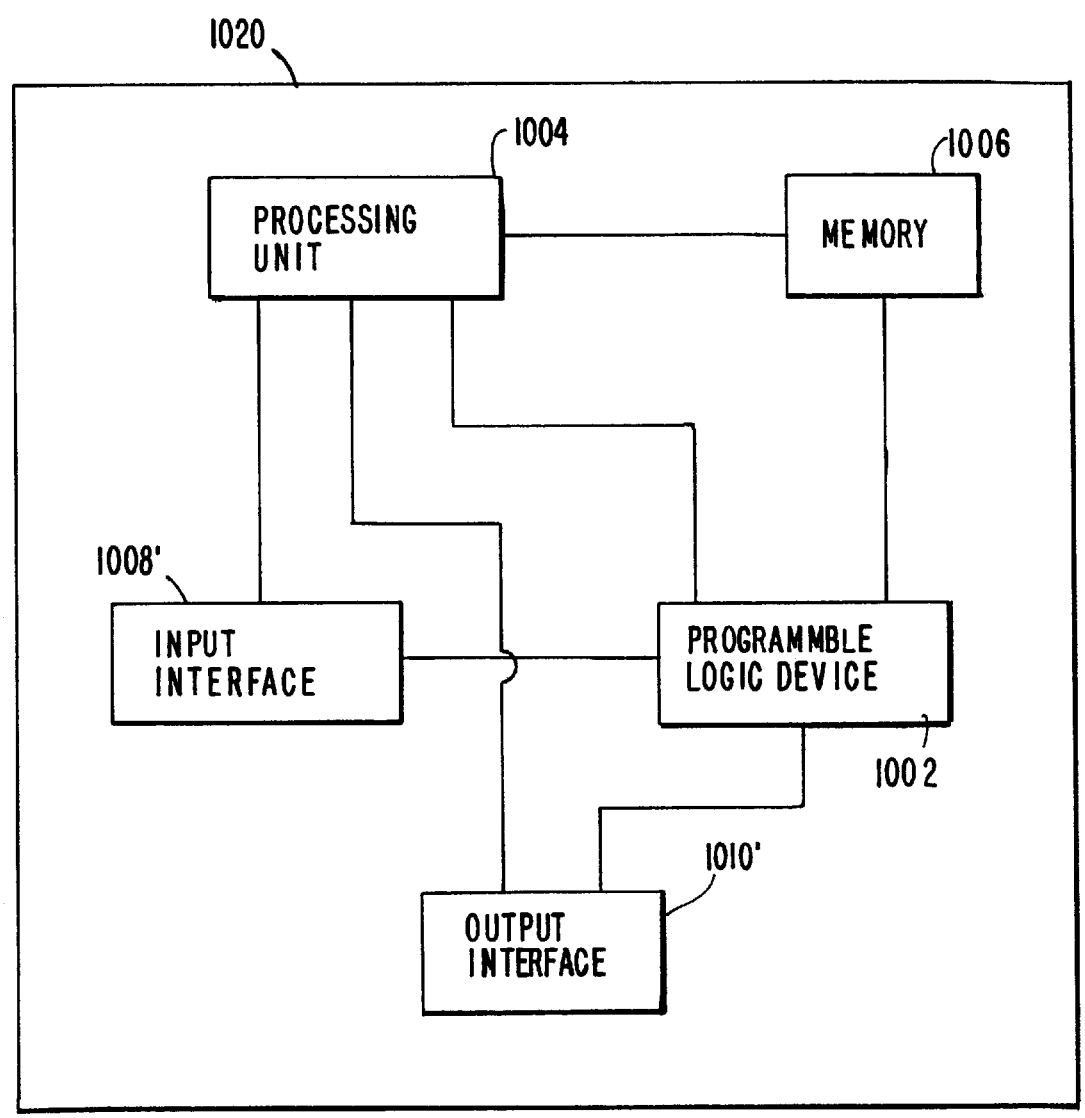
FIG. 10 is another simplified block diagram showing an alternative illustrative use of programmable logic devices in accordance with this invention.

FIG. 10 shows that the programmable logic devices of this invention (e.g., device 1002) can be mounted on a printed circuit board 1020, possibly with other circuitry (e.g., of the various types shown in FIG. 9). In a printed circuit board implementation of FIG. 9 type circuitry, input device or circuitry 1008 from FIG. 9 is likely to be embodied as input interface circuitry 1008' for use in making connections to external input devices and/or circuits (not shown). Similarly, output device or circuitry 1010 from FIG. 9 is likely to be embodied as output interface circuitry 1010' for use in making connections to external output devices and/or circuits (not shown). In other respects the components and connections shown in FIG. 10 may be similar to the corresponding components and connections shown in FIG. 9. Again, various components and connections shown in FIG. 10 can be omitted from circuit board 1020 if desired, and/or other components and connections can be added to that board.

Various technologies can be used to implement programmable logic devices employing the super-regions, regions, and subregions of this invention, as well as the various components of those super-regions, regions, and subregions (e.g., the PLCs and the programmable function control elements ("FCEs") which control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of this invention and that various modifications can be made by those skilled in the art without departing from the scope and spirit of the invention. For example, the number of rows and columns of super-regions can be varied. Similarly, the number of regions in each super-region can be varied, as can the number of subregions in each region. The numbers of the various types of interconnection resources such as PLCs 100, 120, 150, 160, 170, 180, 200, 210, 572, 582, 610, 622, 624, and 626, drivers 102, 172, 212, and 620, etc., can all be varied as desired. Various types of programmable logic can be used in the subregions, and various technologies can be used for the PLCs and other elements of the device, all as suggested above.

The invention claimed is:

1. An integrated circuit comprising:
 a plurality of super-regions of programmable logic disposed on the integrated circuit in a two-dimensional array of rows and columns, each of the super-regions including:
  a plurality of regions of programmable logic, each of the regions including a plurality of subregions of programmable logic, each of the subregions being programmable to perform any of a plurality of logic functions on a plurality of input signals applied to the subregion to produce an output signal which is indicative of the result of performance of the logic function on the input signals; and
  a plurality of local feedback interconnection conductors associated with each of said regions and configured to convey output signals of the subregions in the associated region so that said output signals on said local feedback interconnection conductors are available for programmable application to any of said subregions in the associated region as said input signals;

a plurality of inter-region interconnection conductors configured to convey signals to the regions in the super-region so that said signals on said inter-region interconnection conductors are available for programmable application to any of said subregions in the super-region as said input signals;

a plurality of horizontal inter-super-region interconnection conductors associated with each of said rows and configured to convey signals to, from, and between super-regions in the associated row;

a plurality of vertical inter-super-region interconnection conductors associated with each of said columns and configured to convey signals to, from, and between super-regions in the associated column;

a first plurality of programmable logic connectors configured to selectively apply signals on the inter-region interconnection conductors associated with a super-region directly to each of said subregions in said super-region as said input signals without routing through any of said local feedback interconnection conductors;

a second plurality of programmable logic connectors configured to selectively apply signals on the inter-super-region interconnection conductors associated with a super-region to each of said subregions in said super-region as said input signals without routing through any of said local feedback interconnection conductors; and a third plurality of programmable logic connectors configured to selectively interconnect said horizontal and vertical inter-super-region conductors.

2. The circuit defined in claim 1 further comprising:

a fourth plurality of programmable logic connectors configured to selectively apply signals on said horizontal and vertical inter-super-region interconnection conductors to said inter-region interconnection conductors.

3. The circuit defined in claim 1 wherein one of the inter-super-region conductors includes axially distinct segments, and further comprising programmable circuitry configured to programmably connect two of the axially distinct segments and to amplify a signal passing from one of the segments through the programmable circuitry to the other of the segments.

4. An integrated circuit comprising:

a plurality of super-regions of programmable logic disposed on the integrated circuit in a two-dimensional array of rows and columns, each of the super-regions including:

a plurality of regions of programmable logic, each of the regions including a plurality of subregions of programmable logic, each of the subregions being programmable to perform any of a plurality of logic functions on a plurality of input signals applied to the subregion to produce an output signal which is indicative of the result of performance of the logic function on the input signals; and a plurality of input interconnection conductors associated with each of said regions and configured to convey signals to the subregions in the associated region so that said signals on said input interconnection conductors are available for programmable application to any of said subregions in the associated region as said input signals;

a plurality of inter-region interconnection conductors programmably connected to said input interconnection conductors and configured to convey signals to the regions in the super-region so that said signals on said inter-region interconnection conductors are available for programmable application to any of said subregions in the super-region as said input signals;

a plurality of horizontal inter-super-region interconnection conductors associated with each of said rows and configured to convey signals to, from, and between super-regions in the associated row, said horizontal inter-super-region interconnection conductors being programmably connected to said input interconnection conductors;

a plurality of vertical inter-super-region interconnection conductors associated with each of said columns and configured to convey signals to, from, and between super-regions in the associated column, said vertical inter-super-region interconnection conductors being programmably connected to said input interconnection conductors;

a first plurality of programmable logic connectors configured to selectively apply signals on said horizontal and vertical inter-super-region interconnection conductors to any of the subregions in a super-region adjacent to said inter-super-region conductors as said input signals by routing through the input conductors associated with said subregions and without routing through any of said inter-region interconnection conductors;

a second plurality of programmable logic connectors configured to selectively apply signals on said inter-region interconnection conductors to each of said subregions in a region as said input signals by routing through the input conductors associated with said subregions; and a third plurality of programmable logic connectors configured to selectively interconnect said horizontal and vertical inter-super-region interconnection conductors.

5. The circuit defined in claim 4 further comprising:

a fourth plurality of programmable logic connectors configured to selectively apply signals on said horizontal and vertical inter-super-region interconnection conductors to said inter-region interconnection conductors.

6. A programmable logic device comprising:

a plurality of super-regions of programmable logic disposed on the programmable logic device in a two-dimensional array of rows and columns, each of the super-regions including:

a plurality of regions of programmable logic, each of the regions including a plurality of subregions of programmable logic, each of the subregions being programmable to perform any of a plurality of logic functions on a plurality of input signals applied to the subregion to produce an output signal which is indicative of the result of performance of the logic function on the input signals;

region-feeding interconnection conductors associated with each of said regions and configured to convey signals to all of the subregions in the associated region for programmable application to any of said subregions as said input signals, said region-feeding interconnection conductors running substantially parallel to a first axis of said two-dimensional array; and a plurality of inter-region interconnection conductors associated with each of said regions and configured to convey signals for programmable application to any of said region-feeding interconnection conductors in the associated region, said inter-region interconnection conductors running substantially parallel to a second axis of said two-dimensional array that is substantially perpendicular to the first axis, routing through a region-feeding interconnection conductor associated with a subregion being the sole routing available on said device for applying a signal from any of said inter-region interconnection conductors to that subregion as one of said input signals; and a plurality of inter-super-region interconnection conductors configured to convey signals for programmable application to said inter-region interconnection conductors, said inter-super-region interconnection conductors running substantially parallel to the first axis of said two-dimensional array, routing through an inter-region interconnection conductor associated with a super-region and a region-feeding interconnection conductor associated with a subregion in that super-region being the sole routing available on said device for applying a signal from any of said inter-super-region interconnection conductors to that subregion as one of said input signals.

7. The programmable logic device defined in claim 6 further comprising:

a plurality of programmable logic connectors configured to selectively apply said output signals of each of said subregions in an associated region directly to said inter-super-region interconnection conductors without routing through inter-region interconnection conductors associated with said region.

8. The programmable logic device defined in claim 6 further comprising:

a plurality of programmable logic connectors configured to selectively apply signals on said inter-super-region interconnection conductors to said inter-region interconnection conductors.

9. The programmable logic device defined in claim 6 wherein each of the super-regions further comprises:

a plurality of programmable logic connectors configured to selectively apply signals on said inter-region interconnection conductors to said region-feeding interconnection conductors.

10. The programmable logic device defined in claim 6 wherein each of the super-regions further comprises:

a plurality of programmable logic connectors configured to selectively apply said output signals of each of said subregions in an associated region to said inter-region interconnection conductors associated with said region.

11. A programmable logic device comprising:

a plurality of regions of programmable logic disposed on the programmable logic device in a two-dimensional array of rows and columns, each of the regions including:

a plurality of subregions of programmable logic, each of the subregions being programmable to perform any of a plurality of logic functions on a plurality of input signals applied to the subregion to produce an output signal which is indicative of the result of performance of the logic function on the input signals;

a plurality of input interconnection conductors associated with each of said subregions and configured to convey signals for programmable application to any of said subregions in the associated region as said input signals, said input interconnection conductors running substantially parallel to a first axis of said two-dimensional array;

a plurality of region-feeding interconnection conductors associated with each of said subregions in the region and configured to convey signals for programmable application to said input interconnection conductors in that region, said region-feeding interconnection conductors running substantially parallel to a second axis of said two-dimensional array that is substantially perpendicular to the first axis, routing through an input interconnection conductor associated with a subregion being the sole routing available on said device for applying a signal from any of said region-feeding interconnection conductors to that subregion as one of said input signals; and a plurality of inter-region interconnection conductors programmably connected to the region-feeding interconnection conductors and configured to programmably distribute signals among the regions, said inter-region interconnection conductors running substantially parallel to said first axis of said two-dimensional array, routing through a region-feeding interconnection conductor associated with a region and an input interconnection conductor associated with a subregion in that region being the sole routing available on said device for applying a signal from any of said inter-region interconnection conductors to that subregion as one of said input signals.

12. The programmable logic device defined in claim 11 further comprising:

a plurality of programmable logic connectors configured to selectively apply said output signals of each of said subregions in an associated region directly to said inter-region interconnection conductors without routing through said region-feeding interconnection conductors in said associated region.

13. The programmable logic device defined in claim 11 further comprising:

a plurality of programmable logic connectors configured to selectively apply signals on said inter-region interconnection conductors to said region-feeding interconnection conductors.

14. The programmable logic device defined in claim 11 wherein each of the regions further comprises:

a plurality of programmable logic connectors configured to selectively apply signals on said region-feeding interconnection conductors to said input interconnection conductors.

15. The programmable logic device defined in claim 11 wherein each of the regions further comprises:

a plurality of programmable logic connectors configured to selectively apply said output signals of each of said subregions in an associated region to said region-feeding interconnection conductors associated with said region.

16. A programmable logic device comprising:

a plurality of regions of programmable logic disposed on the programmable logic device in a two-dimensional array of rows and columns, each of the regions including:

a plurality of subregions of programmable logic, each of the subregions being programmable to perform any of a plurality of logic functions on a plurality of input signals applied to the subregion to produce an output signal which is indicative of the result of performance of the logic function on the input signals;

a plurality of input interconnection conductors associated with each of said regions and configured to convey signals for programmable application to any of said subregions in the associated region as said input signals;

a plurality of region-feeding interconnection conductors associated with the region for conveying signals between subregions in the region so that the signals on the region-feeding interconnection conductors are available for programmable application to any of said input conductors in an associated region; and a plurality of inter-region interconnection conductors associated with each of said regions, and configured to convey signals between regions for programmable application to any of said region-feeding interconnection conductors in an associated region; and a plurality of programmable logic connectors configured to selectively apply said output signals of each of said subregions in an associated region directly to said inter-region interconnection conductors without routing through said input interconnection conductors.

17. The programmable logic device defined in claim 16 further comprising:

a second plurality of programmable logic connectors configured to selectively apply signals on said inter-region interconnection conductors to said region-feeding interconnection conductors.

18. The programmable logic device defined in claim 16 wherein each of the regions further comprises:

a second plurality of programmable logic connectors configured to selectively apply signals on said region-feeding interconnection conductors to said input interconnection conductors.

19. The programmable logic device defined in claim 16 wherein routing through an input interconnection conductor associated with a subregion is the sole routing available on said device for applying a signal from any of said inter-region interconnection conductors to that subregion as one of said input signals.

20. The programmable logic device defined in claim 16 wherein routing through a region-feeding interconnection conductor associated with a region and an input interconnection conductor associated with a subregion in that region is the sole routing available on said device for applying a signal from any of said inter-region interconnection conductors to that subregion as one of said input signals.

* * * * *